United States Patent
Sheedy et al.

(10) Patent No.: US 11,535,958 B2
(45) Date of Patent: Dec. 27, 2022

(54) FIBER HAVING INTEGRAL WEAK INTERFACE COATING, METHOD OF MAKING AND COMPOSITE INCORPORATING THE FIBER

(71) Applicant: United Technologies Corporation, Farmington, CT (US)

(72) Inventors: Paul Sheedy, Bolton, CT (US); Neal Magdefrau, Tolland, CT (US); Wayde R. Schmidt, Pomfret Center, CT (US)

(73) Assignee: RAYTHEON TECHNOLOGIES CORPORATION, Farmington, CT (US)

( * ) Notice: Subject to any disclaimer, the term of this patent is extended or adjusted under 35 U.S.C. 154(b) by 256 days.

(21) Appl. No.: 16/536,688

(22) Filed: Aug. 9, 2019

(65) Prior Publication Data

US 2021/0040651 A1    Feb. 11, 2021

(51) Int. Cl.
*D01F 11/00*    (2006.01)
*C03C 14/00*    (2006.01)
(Continued)

(52) U.S. Cl.
CPC ............ *D01F 11/00* (2013.01); *C03C 14/002* (2013.01); *C04B 35/62863* (2013.01); *C04B 35/62865* (2013.01); *C04B 35/62868* (2013.01); *C04B 35/62884* (2013.01); *C04B 35/62894* (2013.01); *C04B 35/62897* (2013.01);
(Continued)

(58) Field of Classification Search
CPC ........ C04B 35/62884; C04B 35/62894; C23C 16/56
See application file for complete search history.

(56) References Cited

U.S. PATENT DOCUMENTS 4,942,011 A    7/1990  Bolt et al.
5,558,907 A    9/1996  Steffier
(Continued)

FOREIGN PATENT DOCUMENTS

CN    104213099 A    12/2014
EP      3556740 A1    10/2019
(Continued)

OTHER PUBLICATIONS

European Extended Seach Report for European Application No. 20188054.9; Application Filing Date: Jul. 28, 2020; dated Dec. 10, 2020; 9 pages.
(Continued)

*Primary Examiner* — Robert A Vetere
(74) *Attorney, Agent, or Firm* — Cantor Colburn LLP

(57) ABSTRACT

Disclosed is a method of coating a high temperature fiber including depositing a base material on the high temperature fiber using atomic layer deposition, depositing an intermediate material precursor on the base material using molecular layer deposition, depositing a top material on the intermediate material precursor or the intermediate layer using atomic layer deposition, and heat treating the intermediate precursor. The intermediate material in the final coating includes a structural defect, has lower density than the top material or a combination thereof. Also disclosed are the coated high temperature fiber and a composite including the high temperature fiber.

7 Claims, 2 Drawing Sheets

(51) Int. Cl.

| | | |
|---|---|---|
| *C04B 35/628* | (2006.01) | |
| *C04B 35/80* | (2006.01) | |
| *C08K 3/04* | (2006.01) | |
| *C08K 3/20* | (2006.01) | |
| *C08K 3/34* | (2006.01) | |
| *C08K 7/06* | (2006.01) | |
| *C08K 7/08* | (2006.01) | |
| *C08K 7/10* | (2006.01) | |
| *C08K 9/02* | (2006.01) | |
| *C23C 16/455* | (2006.01) | |
| *C23C 16/56* | (2006.01) | |

(52) U.S. Cl.
CPC ............... *C04B 35/80* (2013.01); *C08K 3/04* (2013.01); *C08K 3/20* (2013.01); *C08K 3/34* (2013.01); *C08K 7/06* (2013.01); *C08K 7/08* (2013.01); *C08K 7/10* (2013.01); *C08K 9/02* (2013.01); *C23C 16/45525* (2013.01); *C23C 16/56* (2013.01); *C03C 2214/03* (2013.01)

(56) References Cited

U.S. PATENT DOCUMENTS

| | | | |
|---|---|---|---|
| 5,783,139 A | 7/1998 | Curran | |
| 6,322,889 B1* | 11/2001 | Lara-Curzio | C04B 35/565 |
| | | | 428/389 |
| 6,979,490 B2 | 12/2005 | Steffier | |
| 8,617,652 B2 | 12/2013 | Lee | |
| 9,376,750 B2 | 6/2016 | George et al. | |
| 9,834,849 B2 | 12/2017 | Sammelselg et al. | |
| 10,092,927 B2 | 10/2018 | George et al. | |
| 2004/0138046 A1 | 7/2004 | Sherwood, Jr. et al. | |
| 2005/0181192 A1 | 8/2005 | Steffier | |
| 2008/0119098 A1 | 5/2008 | Palley et al. | |
| 2009/0137043 A1 | 5/2009 | Parsons et al. | |
| 2011/0155062 A1* | 6/2011 | Kato | H01L 21/68771 |
| | | | 118/728 |
| 2012/0040581 A1 | 2/2012 | Kim | |
| 2013/0025458 A1 | 1/2013 | Li et al. | |
| 2015/0291473 A1 | 10/2015 | Schmidt | |
| 2016/0159694 A1 | 6/2016 | Chamberlain et al. | |
| 2016/0265143 A1 | 9/2016 | Garnier | |
| 2016/0326672 A1 | 11/2016 | Higuchi et al. | |
| 2017/0141383 A1* | 5/2017 | Dadheech | H01M 4/0426 |
| 2017/0190629 A1 | 7/2017 | Lakrout et al. | |
| 2017/0327948 A1 | 11/2017 | Dadheech et al. | |
| 2017/0342844 A1 | 11/2017 | Schmidt et al. | |
| 2021/0039998 A1 | 2/2021 | Sheedy et al. | |
| 2021/0039999 A1 | 2/2021 | Sheedy et al. | |
| 2021/0075016 A1* | 3/2021 | Choi | H01M 4/1393 |

FOREIGN PATENT DOCUMENTS

| | | |
|---|---|---|
| GB | 2467928 A | 8/2010 |
| KR | 101855718 B1 | 5/2018 |
| WO | 2013142344 A1 | 9/2013 |

OTHER PUBLICATIONS

Putkonen, et al., "Atomic layer deposition of Ti—Nb—O thin films onto electrospun fibers for fibrous and tubular catalyst support structures", J. Vac. Sci. Technol. A 36(1), Jan./Feb. 2018, 7 pages.
Extended European Search Report for European Application No. 20188050.7; Application Filing Date: Jul. 28, 2020; dated Nov. 5, 2020; 7 pages.
Militzer et al., "Deposition of an organic-inorganic hybrid material onto carbon fibers via the introduction of furfuryl alcohol into the atomic layer deposition process of titania and subsequent pyrolysis", Journal of Vacuum Science and Technology: Part A, AVS/AIP, vol. 35, No. 1, Nov. 9, 2016, 13 pages.
Bernardo et al., Advanced Ceramics from Preceramic Polymers Modified at the Nano-Scale: A Review, Materials, 2014, 30 pages.
Extended European Search Report issued in Application No. 20190288.9 dated Dec. 10, 2020, 12 pages.
Final Office Action issued in U.S. Appl. No. 16/536,725 dated Jun. 22, 2022, 8 pages.
Kayaci, Fatma et al., "Polymer-Inorganic Core-Shell Nanofibers by Electrospinning and Atomic Layer Desposition Flexible Nylon ZnO Core-Shell Nanofiber Mats and Their Photocatalytic Activity", ACS Publications, Apl. Materials & Interfaces, 2012, pp. 6185-6194.
Non-Final Office Action issued in U.S. Appl. No. 16/536,725 dated Feb. 24, 2022, 29 pages.
Raj N. Singh, "High-Temperature Mechanical Preperties of a Uniaxially Reinforced Zircon-Silicon Carbide Composite", Journal of the American Ceramic Society, vol. 73, No. 8, Aug. 1990, pp. 2399-2406.
Restriction Requirement issued in U.S. Appl. No. 16/536,725 dated Nov. 26, 2021, 5 pages.

* cited by examiner

US 11,535,958 B2

FIBER HAVING INTEGRAL WEAK INTERFACE COATING, METHOD OF MAKING AND COMPOSITE INCORPORATING THE FIBER

BACKGROUND

Exemplary embodiments pertain to the art of composites, particularly ceramic matrix composites (CMC).

Fiber-reinforced composites, particularly ceramic matrix composites, require a weak fiber-to-matrix interfacial bond to prevent catastrophic failure from propagating matrix cracks through the fiber reinforcement. In particular, the interface needs to provide sufficient fiber/matrix bonding for effective load transfer but must be weak enough to de-bond and slip in the wake of matrix cracking while leaving the fibers substantially intact to bridge the crack and support the far-field applied load. In other words, the interface material provides "crack stopping" by allowing the fiber to slide in the interface coating at the fiber-coating interface or by allowing the coated fiber to move in the matrix by sliding at the coating-matrix interface. Currently available coating materials are limited in composition and there is a desire for a broader range of interface coatings.

BRIEF DESCRIPTION

Disclosed is a method of coating a high temperature fiber including depositing a base material on the high temperature fiber using atomic layer deposition, depositing an intermediate material precursor on the base material using molecular layer deposition, depositing a top material on the intermediate material precursor or the intermediate material using atomic layer deposition, and heat treating the intermediate material precursor to form the intermediate material. The intermediate material in the final coating includes a structural defect, has a lower density than the top material, or a combination thereof.

In addition to one or more of the features described above, or as an alternative to any of the foregoing embodiments, the intermediate material has a structural defect. The structural defect includes pores, cracks, voids, gaps, dislocations, shear bands and combinations thereof.

In addition to one or more of the features described above, or as an alternative to any of the foregoing embodiments, the intermediate material has a thickness of 0.02 to 50 nanometers (nm).

In addition to one or more of the features described above, or as an alternative to any of the foregoing embodiments, the intermediate material precursor includes a hybrid organic/inorganic material.

In addition to one or more of the features described above, or as an alternative to any of the foregoing embodiments, the intermediate material precursor includes an organic material.

In addition to one or more of the features described above, or as an alternative to any of the foregoing embodiments, the intermediate material in the final coating has a porosity of 1% to 75%, or, 1 to 50%, based on the volume of the intermediate material.

Also disclosed is a coated high temperature fiber including a multi-material coating on the high temperature fiber wherein the multi-material coating has a base material in contact with the high temperature fiber, an intermediate material in contact with the base material and a top material in contact with the intermediate material and further wherein the intermediate material includes a structural defect, has a lower density than the top material, or a combination thereof.

In addition to one or more of the features described above, or as an alternative to any of the foregoing embodiments, the intermediate material has a structural defect. The structural defect includes pores, cracks, voids, gaps, dislocations, shear bands, and combinations thereof.

In addition to one or more of the features described above, or as an alternative to any of the foregoing embodiments, the base material has a thickness of 1 to 10,000 nm, or 10 to 1000 nm.

In addition to one or more of the features described above, or as an alternative to any of the foregoing embodiments, the intermediate material includes a metal oxide, carbide, nitride, boride or combination thereof.

In addition to one or more of the features described above, or as an alternative to any of the foregoing embodiments, the intermediate material has a porosity of 1 to 75%, or 1 to 50%, based on the volume of the intermediate material.

In addition to one or more of the features described above, or as an alternative to any of the foregoing embodiments, the intermediate material has a thickness of 0.02 to 50 nm.

In addition to one or more of the features described above, or as an alternative to any of the foregoing embodiments, the top material has a thickness of 1 to 10,000 nm, or, 10 to 1000 nm.

Also disclosed is a composite including a coated high temperature fiber in a matrix wherein the coated high temperature fiber has a multi-material coating on the high temperature fiber and the multi-material coating has a base material in contact with the high temperature fiber, an intermediate material in contact with the base material and a top material in contact with the intermediate material and further wherein the intermediate material includes a structural defect, has lower density than the top material, or a combination thereof.

In addition to one or more of the features described above, or as an alternative to any of the foregoing embodiments, the intermediate material has a structural defect. The structural defect includes pores, cracks, voids, gaps, dislocations, shear bands, and combinations thereof.

In addition to one or more of the features described above, or as an alternative to any of the foregoing embodiments, the base material has a thickness of 1 to 10,000 nm, or, 10 to 1000 nm.

In addition to one or more of the features described above, or as an alternative to any of the foregoing embodiments, the intermediate material has a thickness of 0.02 to 50 nm.

In addition to one or more of the features described above, or as an alternative to any of the foregoing embodiments, the top material has a thickness of 1 to 10000 nm, or 10 to 1000 nm.

In addition to one or more of the features described above, or as an alternative to any of the foregoing embodiments, the intermediate material has a porosity of 1% to 75%, or 1 to 50%, based on the volume of the intermediate material.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed fiber, composite and method are presented herein by way of exemplification and not limitation with reference to the Figures.

A high temperature fiber, as used herein, refers to a fiber which maintains shape and integrity at temperatures greater than or equal to 800° C. A high temperature material is a material that is suitable for use at temperatures greater than or equal to 800° C.

Disclosed herein is a coated high temperature fiber useful in composites, particularly ceramic matrix composites. As discussed above, composites rely on a relatively weak interface to allow the fiber to move and reduce or prevent cracks in the matrix from extending across the fiber. The interface coating described herein specifically locates the debonding area by creating an intermediate layer having a structural defect, lower density than an adjoining layer, or a combination thereof. The interface coating described herein also provides access to a wide range of compositions with improved oxidation resistance compared to typical boron nitride coatings.

Figure 1:
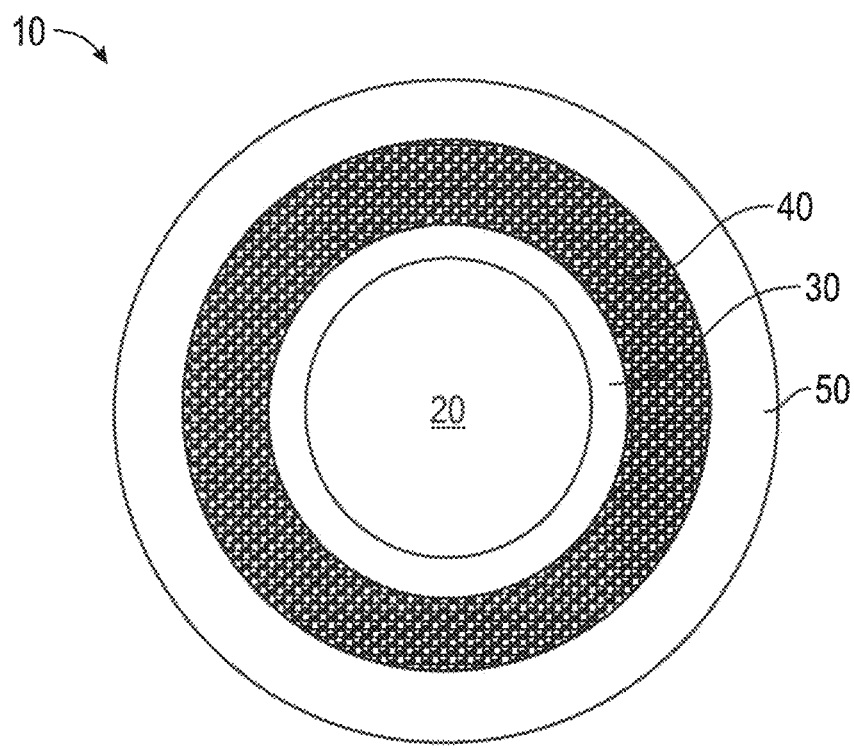
FIGS. 1-3 are cross sections of exemplary coated high temperature fiber embodiments.

FIG. 1 shows a cross section of a coated high temperature fiber 10. The high temperature fiber 20 is surrounded by base material 30. Intermediate material 40 is in contact with base material 30. Top material 50 is in contact with intermediate material 40. While FIG. 1 shows each material (base, intermediate, and top) completely surrounding the underlying material this representation should not be construed as limiting and partial layering is specifically contemplated.

Figure 2:
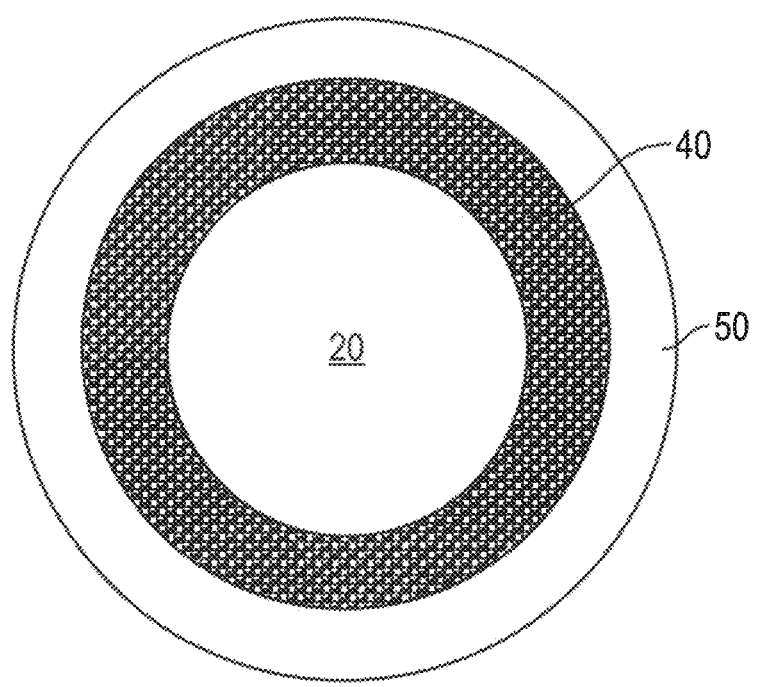

FIG. 2 shows another embodiment of the coated high temperature fiber. The high temperature fiber 20 is surrounded by intermediate material 40. Top material 50 is in contact with intermediate material 40. In this embodiment additional layers may be present between the intermediate material and the top material. While FIG. 2 shows each material completely surrounding the underlying material this representation should not be construed as limiting and partial layering is specifically contemplated.

Figure 3:
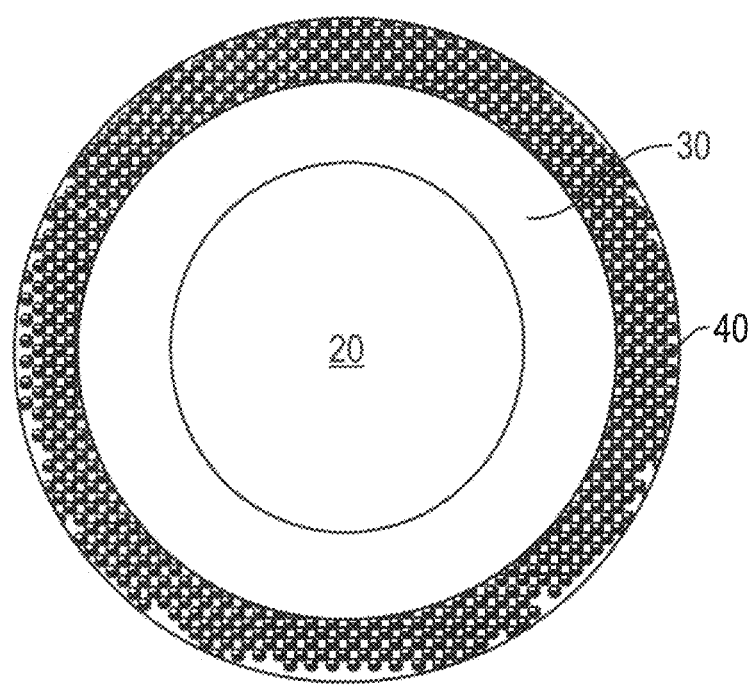

FIG. 3 shows another embodiment of the coated high temperature fiber. The high temperature fiber 20 is surrounded by base material 30 and intermediate material 40 is in contact with the base material. No additional material is disposed on the intermediate material 40 and when the coated high temperature fiber is used in a composite the intermediate material 40 is in contact with the matrix. Additional layers may be present between the intermediate material and the base material. While FIG. 3 shows each material completely surrounding the underlying material this representation should not be construed as limiting and partial layering is specifically contemplated.

It is further contemplated that the intermediate material may have structural defects and/or lower density which is localized to one or more specific areas, distributed along the length of the fiber, localized by depth within the thickness of the intermediate material, distributed through the depth of the intermediate material or any combination thereof.

Exemplary high temperature fibers 20 include carbon fiber (e.g. polyacrylonitrile (PAN), mesophase pitch, rayon, lignin, or polyolefin based), silicon carbide fiber, near-silicon carbide fiber, silicon borocarbide fiber, silicon carbonitride fiber, silicon nitrocarbide fiber, silicon oxycarbide fiber, silicon oxynitride fiber, refractory metal fiber such as rhenium or tantalum, refractory metal carbide fiber such as zirconium carbide, hafnium carbide or tantalum carbide, refractory metal boride fiber such as hafnium diboride or zirconium diboride, refractory metal nitride such as tantalum nitride, zirconium nitride or hafnium nitride, refractory metal oxide fiber such as zirconium oxycarbide, hafnium oxycarbide, zirconium oxide, or hafnium oxide, oxide fiber such as alumina, mullite, borosilicate, or aluminosilicate, glass, and combinations of the foregoing.

The fibers are not limited by diameter or aspect ratio. Additionally the fibers may be continuous, discontinuous, chopped fibers or filaments. They may be arranged in multiple fiber tows, yarns, rovings, non-woven or woven fabrics, or braids.

The base material 30 is deposited by atomic layer deposition. Atomic layer deposition (ALD) is a method by which ultrathin layers of materials can be deposited onto a variety of substrates. The layers are produced by sequentially conducting a series of half-reactions at the surface of a substrate. Each set of half-reactions deposits a layer that is typically 0.2 to 5 Angstroms thick and which conforms to the surface of the underlying substrate. By repeating the reaction sequence, a material of any desired thickness can be deposited onto the substrate surface. Exemplary base materials include boron nitride, aluminum nitride, carbon, silicon carbide, silicon nitride, silicon oxycarbide, hafnium carbide, hafnium nitride, zirconium nitride, boron carbide, zirconium carbide, titanium carbide, tantalum carbide, niobium carbide, zirconium nitride, titanium nitride, titanium diboride, zirconium diboride, hafnium diboride, aluminum oxide, silicon dioxide, zirconium oxide, hafnium oxide, yttrium oxide, yttrium silicate, mullite, lanthanum phosphate, and combinations thereof. The base material may be a composite, a mixed phase or a solid solution. The base material may have a thickness of 1 to 10,000 nm, or, 10 to 1000 nm.

The intermediate material precursor is deposited by molecular layer deposition. The intermediate material precursor may include a hybrid organic/inorganic material and can be formed as described in U.S. Pat. No. 10,092,927. Exemplary intermediate material precursors include alucones such as poly(aluminum ethylene glycol), and titanicones such as poly(titanium ethylene glycol), as well as other metal substituted glycol polymers. Other intermediate material precursors may be formed using a two-step MLD process (e.g. ABAB), utilizing typical ALD metal-bearing precursors (e.g. metal halides, organometallics, etc.) and a homobifunctional or heterobifunctional organic precursor (e.g. ethylene glycol, 1,4-butanediol, 1,6-hexanediol, ethylene diamine, ethanolamine, triethanolamine, para-phenylenediamine, maleic anhydride, glycidol, 3-caprolactone, hydroquinone, glycerol, lactic acid, terephthalic acid, etc.). Materials produced using a three-step process (e.g. ABCABC) using similar reactants are also contemplated. The intermediate material precursor may have a thickness of 0.02 to 50 nm, or, 0.1 to 5 nm. The intermediate material precursor forms structural defects, has a lower density than the adjoining material, or a combination thereof after being heat treated and converts fully or substantially to an inorganic composition. For example, a hybrid organic/inorganic alucone intermediate material precursor deposited using molecular layer deposition using trimethyl aluminum and ethylene glycol precursors may decompose fully or substantially upon heat treatment to result in an intermediate material comprising aluminum oxide. In other embodiments, the intermediate material precursor may be a fully organic composition deposited by molecular layer deposition which is fully or substantially decomposed during heat treatment or subsequent composite processing, leaving no inorganic based intermediate material between the base and top materials. In some embodiments the decomposition of the fully organic composition leaves no remaining material.

The top material 50 is deposited by atomic layer deposition similar to the base material. The top material may be the same as or different from the base material but is generally chosen from the same types of materials as described above with regard to base materials. The top material may have a thickness of 1 to 10,000 nm, or 10 to 1000 nm. The base material and top material may be deposited nominally dense and pinhole-free with respect to the intermediate material and may typically exhibit a porosity that is less than 1% by volume. After heat treatment the base material and/or top material may exhibit shrinkage, cracking, increased crystallinity or a combination thereof.

The coated high temperature fiber is made by depositing a base material on the high temperature fiber using atomic layer deposition, depositing an intermediate material precursor on the base material by molecular layer deposition, and depositing a top material on the intermediate material precursor or on the intermediate material by atomic layer deposition. Conditions for the atomic layer deposition and molecular layer deposition are typically dictated by the reactants and desired products.

The intermediate material precursor is subjected to a heat treatment to modify the intermediate material precursor to form structural defects, typically by decomposition, which may include local densification of the structure. The base material and top material may be subjected to the same heat treatment by depositing the materials to form a precursor coating, and heat treating the precursor coating to form a final coating on the high temperature fiber. It is also contemplated that the intermediate material precursor may be heat treated before the top material is deposited. It is further contemplated that the base material may be subjected to a heat treatment prior to deposition of the intermediate material precursor.

Exemplary heat treatment temperatures are greater than 200° C., or greater than or equal to 600° C., or, greater than or equal to 1200° C. The heat treatment may be performed for select times (minutes to hours) and under controlled atmospheres including inert atmospheres such as argon, nitrogen, helium, mixtures thereof or reactive atmospheres such as oxygen, ozone, SiO, CO, $NH_3$, $H_2$, and mixtures thereof. Additionally, heat treatment may include contact with reactive or non-reactive plasmas for any of the foregoing gases.

Exemplary combinations of fibers, base materials, intermediate materials/intermediate material precursors and top materials are shown in the table below.

The coated high temperature fiber may be incorporated in a matrix to form a composite. Exemplary matrices include polymer, metal, glass, glass-ceramic and ceramic.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the disclosure has been described with reference to an exemplary embodiment or embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this present disclosure, but that the disclosure will include all embodiments falling within the scope of the claims.

What is claimed is:

1. A method of coating a high temperature fiber comprising depositing a base material on the high temperature fiber using atomic layer deposition, depositing an intermediate material precursor on the base material by molecular layer deposition, depositing a top material on the intermediate material precursor or intermediate material by atomic layer deposition, and heat treating the intermediate layer precursor to form the intermediate material in contact with the base material, wherein the intermediate layer comprises a structural defect, has a lower density than the top material or a combination thereof.

2. The method of claim 1, wherein the intermediate material has a structural defect selected from the group consisting of pores, cracks, voids, gaps, dislocations, shear bands and combinations thereof.

3. The method of claim 1, wherein the intermediate material has a thickness of 0.02 to 50 nm; and
wherein the top material has a porosity that is less than 1% by volume.

4. The method of claim 1, wherein the intermediate material precursor comprises a hybrid organic/inorganic material.

5. The method of claim 1, wherein the intermediate material precursor comprises an organic material.

6. The method of claim 1, wherein the intermediate material has a porosity of 1 to 75%.

| FIBER | BASE | INTERMEDIATE | TOP |
| --- | --- | --- | --- |
| SiC | Nitride (BN or AlN) | Alucone or titanicone | Carbide (SiC) |
| Carbon | Nitride (AlN or HfN) | Alucone or titanicone | Carbide (HfC) |
| Carbon | AlN | Alucone or polyimide | AlN |
| Si based | BN | Alucone, titanicone, or polyimide | SiC or TiN |
| Oxide based | AlN or BN | Alucone or titanicone | AlN or TiN |

7. The method of claim 1, wherein heat treating comprises heating at a temperature greater than 200° C.

* * * * *